United States Patent [19]

Yamaguchi

[11] Patent Number: 5,539,676
[45] Date of Patent: Jul. 23, 1996

[54] METHOD OF IDENTIFYING PROBE POSITION AND PROBING METHOD IN PROBER

[75] Inventor: Masao Yamaguchi, Tokyo, Japan

[73] Assignee: Tokyo Electron Limited, Tokyo, Japan

[21] Appl. No.: 228,378

[22] Filed: Apr. 15, 1994

[30] Foreign Application Priority Data

Apr. 15, 1993 [JP] Japan ................................. 5-112237
Feb. 28, 1994 [JP] Japan ................................. 6-055260

[51] Int. Cl.$^6$ ........................... G01R 1/067; G01R 31/02
[52] U.S. Cl. ................... 364/559; 364/489; 382/151; 382/152; 324/758; 356/400; 356/401
[58] Field of Search .................................. 364/489, 559, 364/474.28, 474.35, 474.37, 167.01; 382/146, 151, 152; 356/400, 401; 250/491.1; 324/758

[56] References Cited

U.S. PATENT DOCUMENTS

| | | | |
|---|---|---|---|
| 4,553,845 | 11/1985 | Kuroki et al. | 356/401 |
| 4,820,975 | 4/1989 | Diggle | 324/758 |
| 4,853,880 | 8/1989 | Akamatsu et al. | 364/559 |
| 4,856,904 | 8/1989 | Akagawa | 364/559 |
| 4,864,227 | 9/1989 | Sato | 364/559 |
| 4,929,893 | 5/1990 | Sato et al. | 324/758 |
| 4,934,064 | 6/1990 | Yamaguchi et al. | 324/758 |
| 4,966,520 | 10/1990 | Yokota et al. | 414/786 |
| 5,043,910 | 8/1991 | Chiba | 364/489 |
| 5,097,406 | 3/1992 | Narasimhan et al. | 364/559 |
| 5,124,931 | 6/1992 | Iwamatsu et al. | 364/489 |
| 5,150,041 | 9/1992 | Eastin et al. | 324/758 |
| 5,172,053 | 12/1992 | Itoyama | 324/758 |
| 5,189,707 | 2/1993 | Suzuki et al. | 382/151 |
| 5,274,575 | 12/1993 | Abe | 364/489 |
| 5,321,352 | 6/1994 | Takebuchi | 324/758 |
| 5,408,189 | 4/1995 | Swart et al. | 356/400 |
| 5,416,592 | 5/1995 | Mori et al. | 356/400 |
| 5,422,579 | 6/1995 | Yamaguchi | 324/758 |
| 5,442,299 | 8/1995 | Caggiano | 356/401 |

Primary Examiner—Ellis B. Ramirez
Assistant Examiner—Eric W. Stamber
Attorney, Agent, or Firm—Oblon, Spivak, McClelland, Maier & Neustadt

[57] ABSTRACT

A prober for a semiconductor wafer includes a probe card mounted in a card mounting opening and having a plurality of probes. A work table for placing a wafer thereon and movable in X, Y, Z, and θ directions is disposed under the probe card. The work table includes a camera, and its operation is controlled by a controller. A tester is connected to the probe card through a test head. The probe card has a probe arrangement center that should be aligned with the center of the card mounting opening. In order to identify the positions of the probes after the probe card is mounted to the card mounting opening, the position of the center of the card mounting opening on absolute coordinates and the relative positions of the probes of the probe card are stored first in the memory of the controller. Subsequently, at least one of the probes of the probe card mounted in the card mounting opening is determined as a reference probe, the position of the reference probe on the absolute coordinates is detected, and the detected position is input to the controller. The relative position of the probe arrangement center relative to the reference probe is calculated by the controller by referring to the relative positions of the probes stored in the memory.

6 Claims, 5 Drawing Sheets

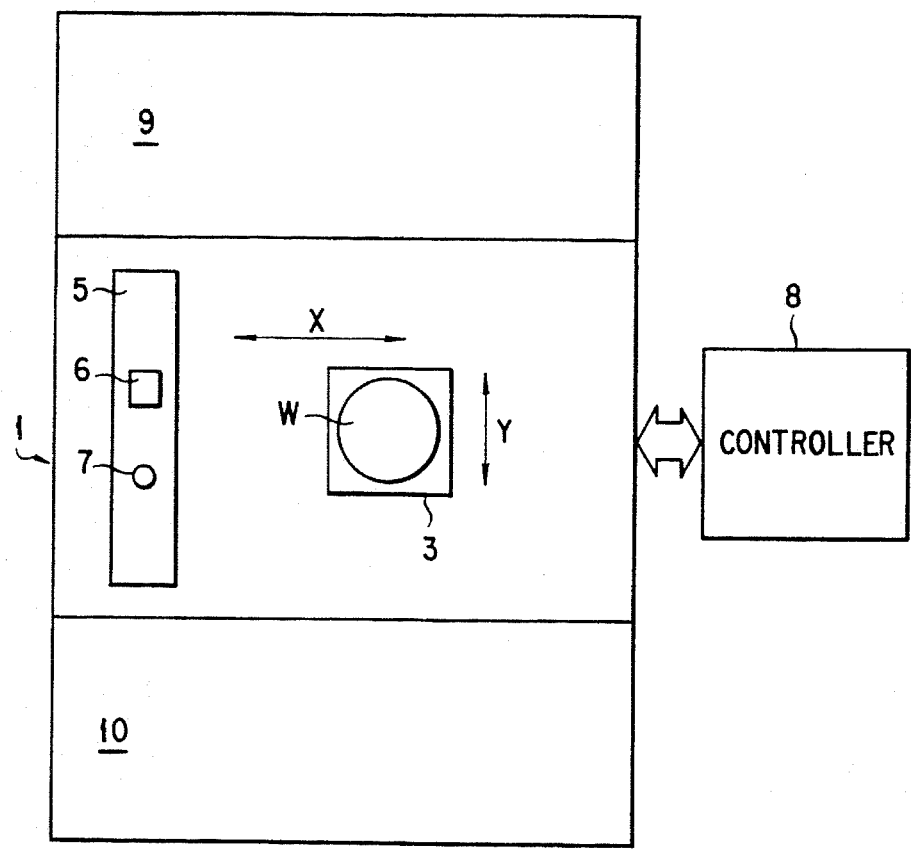
F I G. 2
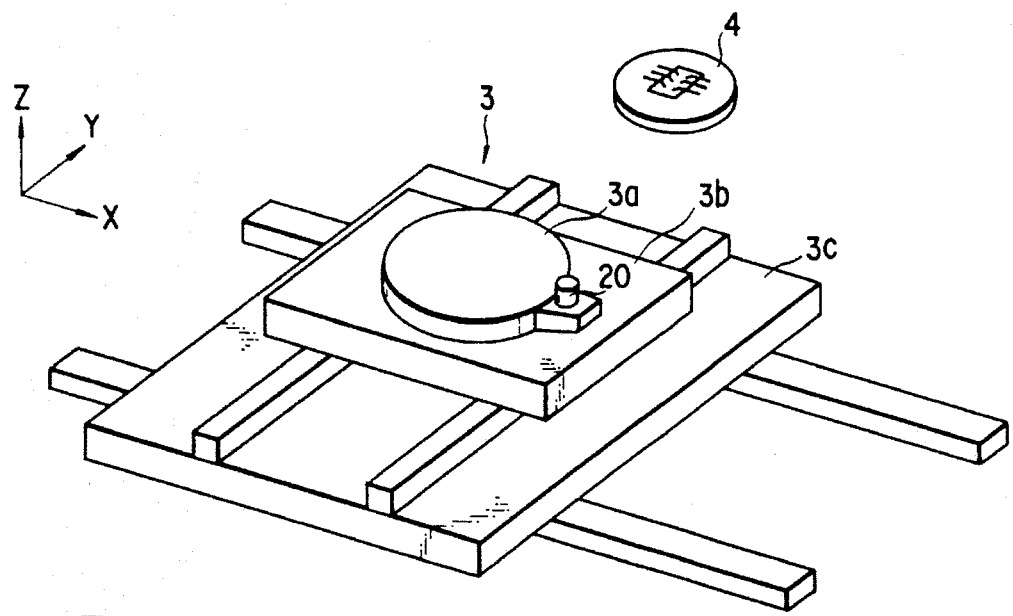
F I G. 3

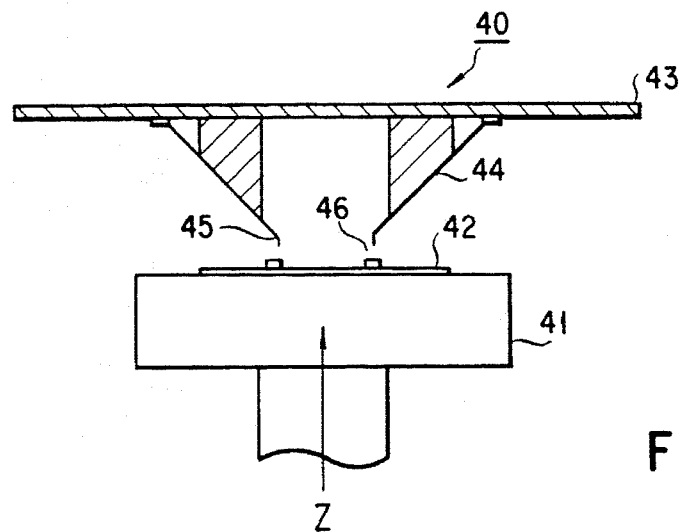
F I G. 4
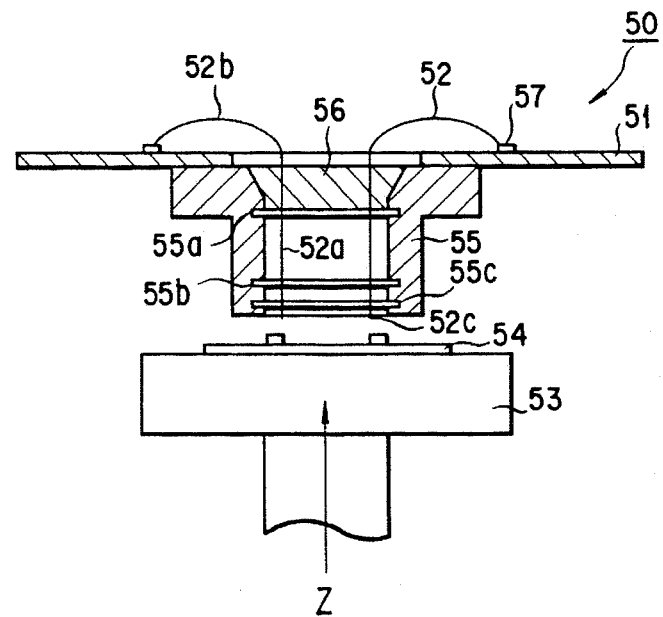
F I G. 5
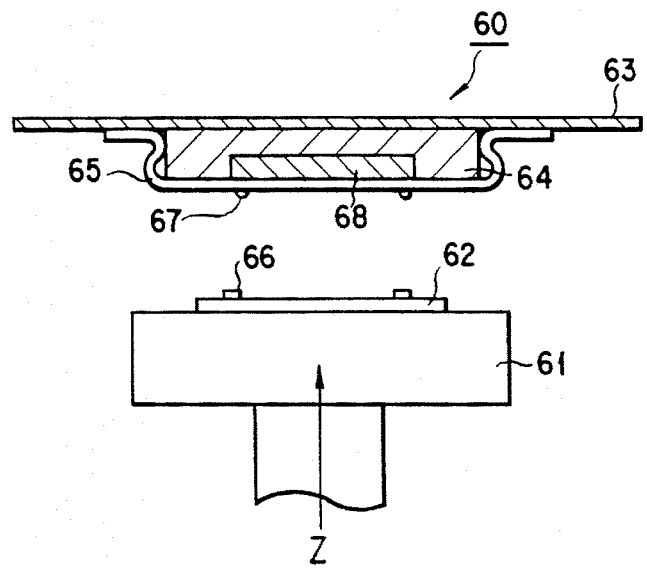
F I G. 6

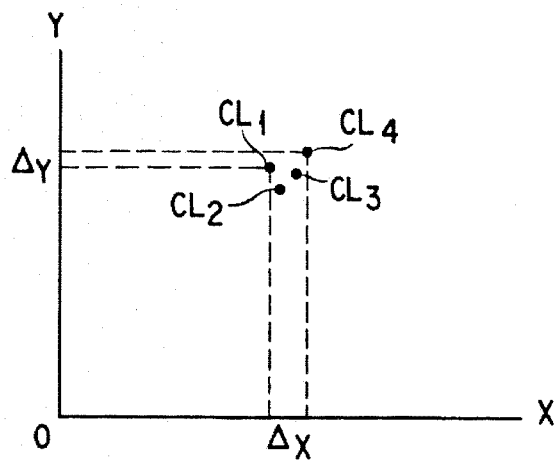
F I G. 11
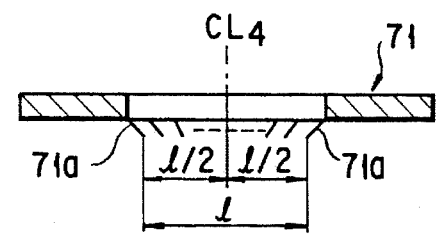
F I G. 12
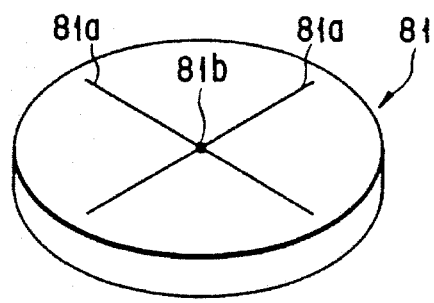
F I G. 13
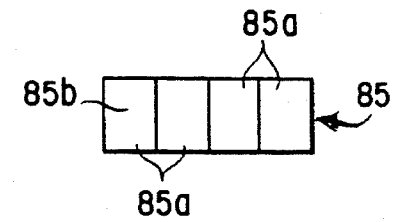
F I G. 14

METHOD OF IDENTIFYING PROBE POSITION AND PROBING METHOD IN PROBER

BACKGROUND OF THE INVENTION

1. Field of the Invention

The present invention relates to a method of identifying a probe position and a probing method in a prober for a substrate to be examined, e.g., a semiconductor wafer.

2. Description of the Related Art

In the semiconductor device manufacturing process, a large number of semiconductor devices are formed as chips on a semiconductor wafer. Then, the wafer is cut into the chips, i.e., the semiconductor devices in a die cut step. In the semiconductor device manufacturing process, before the wafer is cut, the electrical characteristics of the semi-completed semiconductor devices are tested and determined by using a prober. Only the semiconductor devices that are determined as non-defective articles as the result of test measurement are sent to the subsequent steps, e.g., packaging.

The prober has a wafer work table which is made to be movable in the X, Y, Z, and θ directions. A probe card having a large number of probes corresponding to the electrode pads of a semiconductor device is fixed above the work table with an appropriate holding tool. For measurement, a test target, e.g., a wafer, is placed and held on the work table. The work table is driven, the probes are brought into contact with the electrode pads of the semiconductor device, and test measurement is performed by a tester through the probes.

In order to accurately bring the probes of the prober into electrical contact with the electrode pads of the semiconductor device, the distal ends of the probes must be correctly guided to the electrode pads of the semiconductor device and aligned with them. Conventionally, a specific semiconductor device on the wafer is moved to under the probe card by moving the stage. Then, the distal ends of the probes are recognized by utilizing, e.g, a camera, and manually aligned with the electrode pads of the semiconductor device. In this method, the operator must be specially trained, and the aligning operation becomes very cumbersome. When a probe card, e.g., a probe card having probes of a so-called vertical type, that visually conceals contact between the probes and the electrode pads is used, visual observation for the purpose of alignment is difficult, sometimes making it difficult to perform accurate operation.

SUMMARY OF THE INVENTION

It is an object of the present invention to provide a method identifying a probe position in a prober that enables automatic efficient alignment between the probes of a probe card and the contact portions of a test target, and a probing method using this identifying method.

According to a first aspect of the present invention, there is provided, in a prober comprising a probe card having a plurality of probes, and a card mounting portion for mounting the probe card, the probe card having a probe arrangement center that should be aligned with a center of the card mounting portion, a method of identifying, after mounting the probe card on the card mounting portion, positions of the probes, comprising the steps of:

storing a position of the center of the card mounting portion on absolute coordinates and relative positions of the probes on the probe card in a memory of a controller;

mounting the probe card to the card mounting portion, setting one of the probes of the probe card as a reference probe, detecting a position of the reference probe on the absolute coordinates, and inputting the detected position in the controller;

calculating a relative position of the probe arrangement center relative to the reference probe by the controller by referring to the relative positions of the probes stored in the memory;

calculating a position of the probe arrangement center on the absolute coordinates by the controller based on the position of the reference probe on the absolute coordinates and the relative position of the probe arrangement center; and calculating a positional error of the position of the probe arrangement center with respect to the position of the center of the card mounting portion on the absolute coordinates by the controller, and identifying the positions of the probes on the absolute coordinates based on the calculated positional error.

According to a second aspect of the present invention, there is provided, in a prober comprising a probe card having a plurality of probes, and a card mounting portion for mounting the probe card, a method of identifying, after mounting the probe card on the card mounting portion, positions of the probes, comprising the steps of:

storing relative positions of the probes on the probe card in a memory of a controller;

mounting a dummy card having a shape congruent with that of the probe card on the card mounting portion, detecting an imaginary center of the dummy card on absolute coordinates, and inputting the detected imaginary center in the controller, the imaginary center being arranged to correspond to a probe arrangement center of the probe card;

mounting the probe card to the card mounting portion, setting one of the probes of the probe card as a reference probe, detecting a position of the reference probe on the absolute coordinates, and inputting the detected position in the controller;

calculating a relative position of the probe arrangement center relative to the reference probe by the controller by referring to the relative positions of the probes stored in the memory;

calculating a position of the probe arrangement center on the absolute coordinates by the controller based on the position of the reference probe on the absolute coordinates and the relative position of the probe arrangement center; and calculating a positional error of the position of the probe arrangement center with respect to the position of the imaginary center of the dummy card on the absolute coordinates by the controller, and identifying the positions of the probes on the absolute coordinates based on the calculated positional error.

A probing method according to the present invention that employs the probe position identifying methods according to the first and second aspects further comprises the steps of:

placing a test target on a work table of the prober;

driving the work table through the controller by referring to the positions of the probes on the absolute coordinates, and bringing the probes into contact with the test target; and sending a test signal from a tester of the prober to the test target through the probes, and measuring electrical characteristics of the test target by the tester in accordance with a response signal sent back from the test target.

According to the present invention, identification of the probe positions of the probe card can be performed easily, thus increasing the efficiency of the operation. Especially, even when the contact between the electrode pads on the wafer and the probes is difficult to observe, as in a probe card having probes of a vertical type, alignment of the electrode pads and the probes can be easily performed.

BRIEF DESCRIPTION OF THE DRAWINGS

FIG. 2 is a layout plan view showing the prober shown in FIG. 1;

FIG. 3 is a perspective view showing the wafer rest table of the prober shown in FIG. 1 and its driving stage;

FIG. 4 is a schematic sectional view showing a probe card having probes of a horizontal type;

FIG. 5 is a schematic sectional view showing a probe card having probes of a vertical type;

FIG. 6 is a schematic sectional view showing a probe card having probes of a bump type;

FIG. 11 is a graph showing a cumulative error in mounting the probe card shown in FIG. 8;

FIG. 12 is a schematic sectional view showing the probe arrangement state and the probe arrangement center of still another probe card;

FIG. 13 is a perspective view showing a dummy card used in a method according to the present invention; and FIG. 14 is a plan view showing an example of the layout of a semiconductor chip group formed on a wafer in a matrix manner.

DETAILED DESCRIPTION OF THE PREFERRED EMBODIMENTS

The arrangement and operation of a prober as a whole for a semiconductor wafer according to an embodiment of the present invention will be schematically described with reference to FIGS. 1 to 3.

Figure 1:
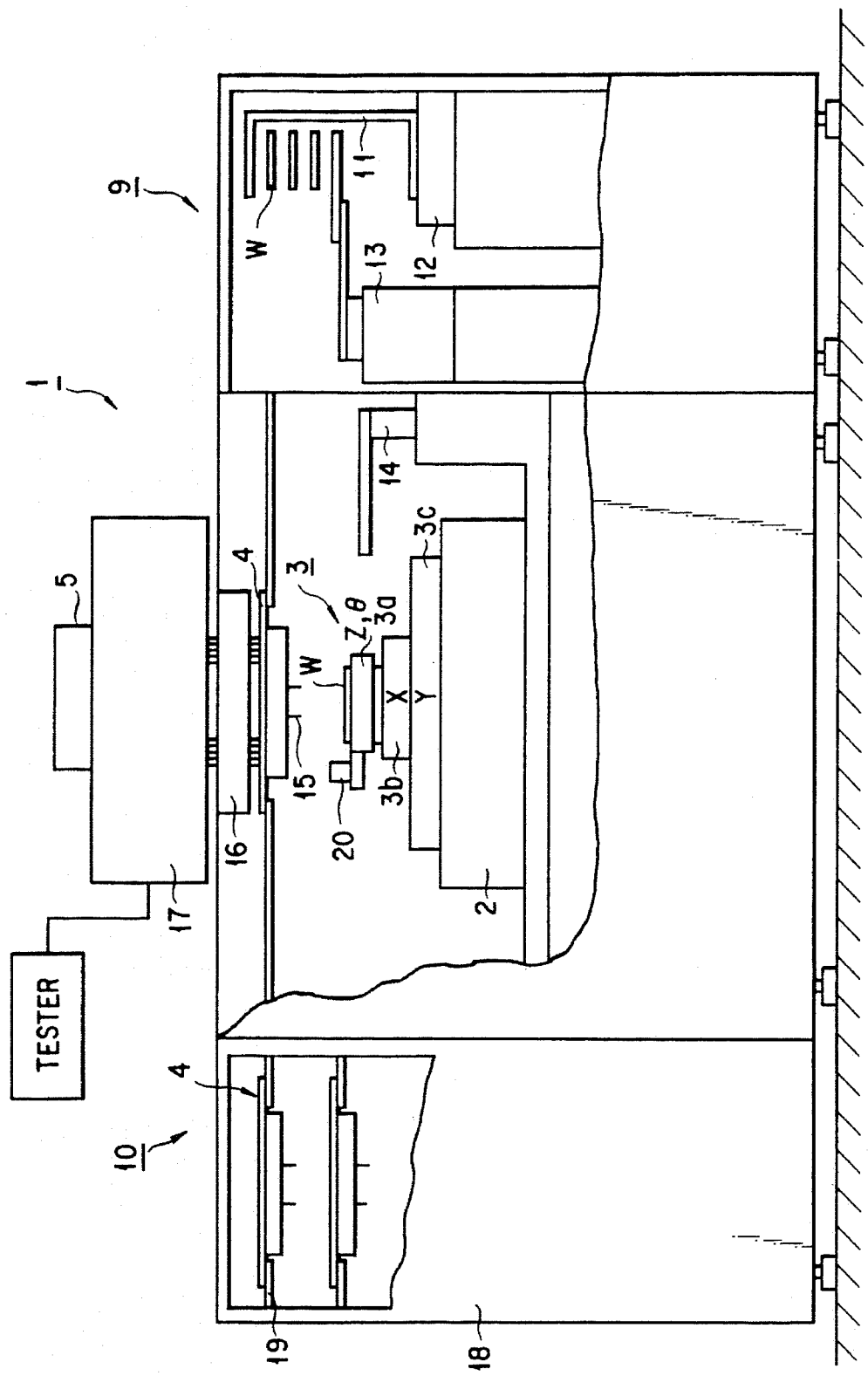
FIG. 1 is a schematic side view showing a prober according to an embodiment of the present invention.

Referring to FIG. 1, a stage base 2 is provided at substantially the center of a prober 1. A work table 3 for placing a semiconductor wafer W thereon and holding it by vacuum suction is mounted on the stage base 2. As shown in FIG. 3, the work table 3 is constituted by a Z-and θ-direction stage 3a, an X-direction stage 3b, and a Y-direction stage 3c, and is movable in a desired direction on the stage base 2. A probe card 4 for probe examination can be provided above the work table 3 to oppose the semiconductor wafer w.

As shown in FIG. 2, an alignment unit 5 is provided at the center of the prober 1. The alignment unit 5 is provided with an image recognition unit for alignment, e.g., a camera 6. When alignment is to be performed, the work table 3 is moved to a position under the camera. The alignment unit 5 has a control stick 7. The control stick 7 is operated by the operator so as to manually control the moving amount of the work table 3 on the order of microns. Furthermore, the driving mechanism of the work table 3 is connected to a controller 8. Thus, the work table 3 can be driven in the X, Y, Z, and θ directions in accordance with a control signal from the controller 8, thereby aligning the electrode pads of the semiconductor wafer W placed on the work table 3 with the probe card 4.

An auto loader 9 for loading in/out the semiconductor wafer W is arranged on the right side (FIG. 1) of the prober 1. An exchanger 10 for exchanging the probe card 4 is provided on the left side (FIG. 1) of the prober 1.

In the auto loader 9, a wafer cassette 11 housing a plurality of semiconductor wafers W at regular intervals with each other in the vertical direction is replaceably arranged on a cassette work table 12. A loader stage 13 which is movable in the horizontal plane and a wafer handling arm 14 which can be driven by a Y-direction driving mechanism and a Z-direction moving mechanism (neither are shown) are provided between the wafer cassette 11 and the work table 3.

when a semiconductor wafer W is to be probed by the probe card 4, the wafer W is conveyed by the loader stage 13 to be close to the work table 3, and then is transferred by the wafer handling arm 14 such that it is placed and held on the work table 3. Thereafter, probes 15 of the probe card 4 which is accurately positioned at a predetermined position by a method to be described later are brought into contact with predetermined contact points, e.g., electrodes pads, on the wafer W. The probes 15 are connected to a test head 17 through a pogo-pin ring 16, and the test head 17 is connected to a tester.

For examination, a test signal is sent to each chip from the tester, and the electrical characteristics of the respective chips are measured in accordance with the response signals sent back from the respective chips. That is, the non-defectiveness or defectiveness of each semiconductor device formed on the wafer W as the test target is determined by the tester. After the examination is completed, the wafer W is moved again onto the loader stage 13 by the wafer handling arm 14 and conveyed to the wafer cassette 11 by the loader stage 13.

In the exchanger 10, a plurality of probe cards 4 of one or more types corresponding to the semiconductor devices formed on the semiconductor wafer W as the test target are housed on housing shelves 19 of a housing chamber 18 at intervals with each other in the vertical direction. The housed probe cards 4 are exchanged as required for the probe card 4 provided in the main body of the prober 1.

An image recognizing means, e.g., a camera 20, is provided on a side of the Z- and θ-direction stage 3a of the work table 3 and can recognize the image of the lower surface of the probe card 4. The camera 20 can be driven to a desired position together with the work table 3 by driving the Z- and θ-direction stage 3a, the X-direction stage 3b, and the Y-direction stage 3c by the control signal from the controller 8.

Probe cards 4 that can be adopted in the probe apparatus 1 will be described with reference to FIGS. 4 to 6.

FIG. 4 shows a probe card 40 having probes of a so-called horizontal type. The probe card 40 has a probe card substrate 43 which is arranged to be substantially parallel to the examination surface of a substrate 42 to be tested, e.g., a wafer, placed on a work table 41. Probes 44 made of a conductor, e.g., gold (Au) or tungsten (W), are mounted on the probe card substrate 43 to be downwardly inclined, thus forming an angle with the probe card substrate 43. Distal ends 45 of the probes 44 are position-adjusted such that they are abutted against corresponding electrode pads 46 of the substrate 42.

For examination, the work table 41 is driven by a driving unit (not shown) in a direction indicated by an arrow Z, thereby bringing the distal ends 45 of the respective probes 44 into electrical contact with the electrode pads 46. A test signal is sent from the tester to each chip. The electrical characteristic test is executed for the respective chips in accordance with the response signals sent back from the respective chips.

FIG. 5 shows a probe card 50 having probes of a so-called vertical type. The probe card 50 has a substantially disk-shaped probe card substrate 51, probes 52, and a guide portion 55 for guiding the probes 52 to a substrate 54 to be tested, e.g., a wafer, placed on a work table 53. Each probe 52 is made of a conductor, e.g., gold (Au) or tungsten (W), and its lower portion 52a is arranged to be perpendicular to the inspection substrate.

The guide portion has a probe fixing plate 55a, an upper guide plate 55b, and a lower guide plate 55c from its upper portion in this order. Holes capable of mounting the corresponding probes 52 therein by insertion are formed in these plate members 55a, 55b, and 55c. The probes 52 are mounted by insertion in the corresponding holes and fixed by a fixing resin 56. Upper portions 52b of the probes are bent in the arched manner and electrically connected to the probe card substrate 51 at points 57.

For examination, the work table 53 is driven in the direction indicated by an arrow Z, and distal end portions 52c of the probes are abutted against electrode pads 58 of the substrate 54 to be tested. At this time, the probes 52 are elastically flexed between the probe fixing plate 55a and the upper guide plate 55b to absorb the force in the vertical direction. In this manner, a test signal is sent from the tester to the probes 52 electrically connected to the electrode pads 58 of the substrate 54, and the electrical characteristics of the respective chips are measured in accordance with response signals sent from the respective chips.

FIG. 6 shows a probe card 60 having probes of a so-called bump type. The probe card 60 has a probe card substrate 63 arranged to be substantially parallel to the examination surface of a substrate 62 to be tested, e.g., a wafer, placed on a work table 61. A block 64 is mounted to the lower surface of the probe card substrate 63, and an elastic membrane substrate 65 is arranged to cover the block 64. Bumps 67 made of a conductor, e.g., gold (Au) or tungsten (W), are mounted at positions of the membrane substrate 65 corresponding to electrode pads 66 on the substrate 62 to be tested. Furthermore, a damper member 68 is arranged on the rear side of the bumps 67 to absorb the pressure caused by contact of the bumps 67 and the electrode pads 66.

For examination, the work table 61 is driven by a driving unit (not shown) in a direction indicated by an arrow Z, and the bumps 67 and the electrode pads 66 are brought into electrical contact with each other. A test signal is sent from the tester to each chip, and the electrical characteristic test is executed for the respective chips in accordance with response signals sent back from the respective chips.

The present invention can be applied to any types of the probe cards described above.

A case wherein a semiconductor chip circuit is subjected to the probing test by the prober 1 will be described with reference to FIGS. 1 to 3 and 7.

Figure 7:
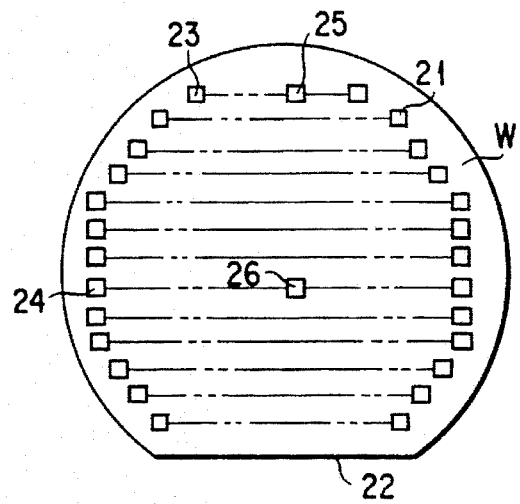
FIG. 7 is a plan view showing the semiconductor device-forming surface of a semiconductor wafer as a test target.

As shown in FIG. 7, a large number of chips 21 are formed on the semiconductor wafer W. An orientation flat 22 is formed in the wafer W. The wafer W is pre-aligned by setting the orientation flat 22 in a desired direction on the loader stage 13. After pre-alignment, the wafer W is placed on the work table 3 of the stage base 2 by the wafer handling arm 14. As a result, the wafer W as the test target opposes the probe card 4.

The probe test can be performed, e.g., by dividing one semiconductor wafer W into four areas. More specifically, the test is conducted in the order of for the upper left area, upper right area, lower left area, and lower right area shown in FIG. 7. For example, 64 semiconductor chips 21 are formed in each area. A plurality of electrode pads are formed on each chip 21, and one of the electrode pads is selected as a reference electrode pad. Usually, as the reference electrode pad, one of the electrode pads formed on a chip 23, 24, 25, or 26 at the upper left portion of each area which is located on the upper left corner of the chip is selected.

For examination, a corresponding reference probe is brought into electrical contact with the reference electrode pad, and the directions of the wafer W on the work table 3 and the probe card 4 in the θ direction are accurately aligned, so that other probes are also aligned to be able to electrically contact the corresponding electrode pads. For this purpose, the work table 3 must be moved first in the X-Y plane, the distal end position of the reference probe must be detected by the camera 20 mounted to the work table 3, and the positional information must be stored in the controller 8 (teaching step). This teaching step is necessary because the distal end position of the reference probe is slightly deviated from the ideal position.

Figure 8:
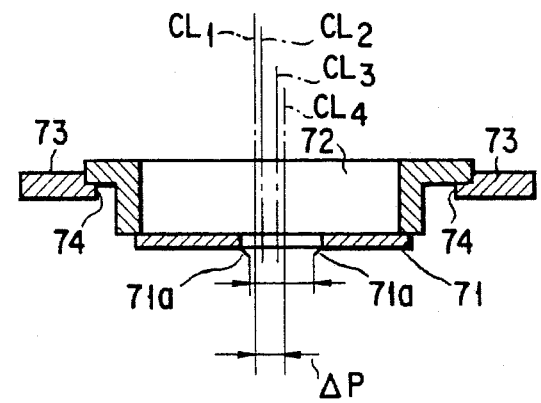
FIG. 8 is a schematic sectional view showing the mounted state of another probe card in order to explain a method according to the present invention.

For example, when a probe card 71 shown in FIG. 8 is used, the probe card 71 is exchangeably mounted through a holding body 72, e.g., a ring insert. The holding body 72 is mounted in a card mounting opening 74 formed in a head plate 73 of the apparatus body. A plurality of probes 71a are provided to the probe card 71. Although the type of the probes 71a is different from that of the probes 52 shown in FIG. 5, the probes 71a are arranged almost vertically, and their distal end portions contact the wafer W on the work table 3 substantially vertically.

Figure 9:
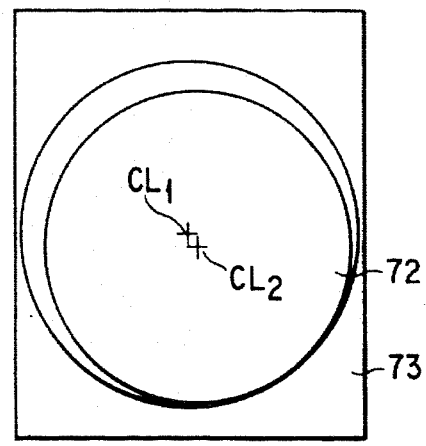
FIG. 9 is a schematic plan view showing the mounted state of the probe card shown in FIG. 8.
Figure 10:
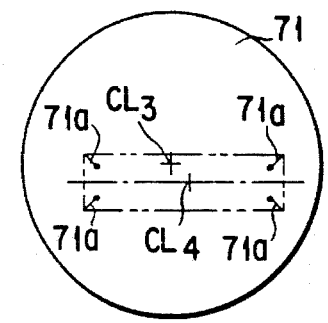
FIG. 10 is a plan view showing the probe arrangement area of the probe card shown in FIG. 8.

When this probe card 71 is employed, a positional deviation ΔP of the reference probe is caused due to the cumulative mounting error to be described below. First, as shown in FIG. 9, a ring center $CL_2$ of the card holding body 72 is slightly deviated from a center $CL_1$ of the card mounting opening 74. Also, the probe card 71 is originally mounted such that its card center $CL_3$ is deviated from the ring center $CL_2$ of the card holding body 72. As shown in FIG. 10, when the probes 71a are arranged on the probe card 71, their probe arrangement center $CL_4$ is deviated from the card center $CL_3$ of the probe card 71. These mounting errors are cumulatively caused in the X and Y directions as shown in FIG. 11.

Ideally, it suffices if the probe arrangement center $CL_4$ of the probe card 71 is aligned with the center $CL_1$ of the card mounting opening 74. However, the probe arrangement center $CL_4$ of the probe card 71 cannot be directly observed, and thus its position on the absolute coordinates cannot be immediately recognized. Accordingly, conventionally, practical alignment methods are used such that alignment is gradually performed by actually observing the probes of the probe card and the electrode pads of the chips of the wafer, by looking the probes and the electrode pads up and down by using, e.g., a television camera to recognize their position on the absolute coordinates, or by repeatedly performing a step of forming scratches in the electrode pads with the probe points several times so that alignment is performed to obtain accurate touch. With these methods, however, the operator must be specially trained, and the aligning operation becomes very cumbersome.

A method of identifying the positions of the probes according to the present invention that solves the problems of the conventional methods will be described by way of the probe card 71 shown in FIG. 8.

As the preliminary step, the position of the center $CL_1$ of the card mounting opening 74 is measured in advance during, e.g., the manufacture of the apparatus. The position of the center $CL_1$ on the X-Y absolute coordinates of the apparatus is stored in the memory of the controller 8. Information regarding the relative positions of the probes 71a in the X and Y directions is also stored in the memory of the controller 8. These pieces of stored positional information can be read as required. The relative positions of the probes 71a can be obtained from a design specification which is necessary for disposing the probes and which indicates the X- and Y-coordinate components of the probes. This design specifications are created based on the design specifications of the semiconductor devices, i.e., the chips, on the wafer w and used when the probes 71a are disposed.

In the first step, one of the probes 71a of the probe card 71 is determined as the reference probe, and the work table 3 is driven such that the camera 20 on the work table 3 side is located under this reference probe. The center of the reference probe is set to coincide with the reference point in the view field of the camera 20, thereby detecting the position of the reference probe on the absolute coordinates through the camera 20. The position of the reference probe on the absolute coordinates is stored in the memory of the controller 8.

When the probe card 71 is mounted such that its θ direction, i.e., its angular orientation substantially coincides with the preset value, it suffices if the position of at least one reference probe is detected in the first step. Also, when information concerning the deviation in the θ direction is detected in advance and stored in the memory of the controller 8, one reference probe suffices. However, when two or more reference probes are used, the deviation of the probe card 71 in the θ direction can be calculated, in relation to the work table 3, from the positions of the plurality of reference probes on the absolute coordinates while referring to the information on the relative positions of the probes 71a, and the position of the probe arrangement center $CL_4$ can be obtained more accurately.

In the second step, the relative position of the probe arrangement center $CL_4$ relative to the reference probe is calculated. In this calculation, the information on the relative positions of the probes 71a stored in the memory of the controller 8 is referred to. When two or more reference probes are used, information on the deviation of the probe card 71 in the θ direction can also be obtained, in relation to the work table 3, while referring to the information on the relative positions of the probes 71a.

In the third step, the position of the probe arrangement center $CL_4$ on the absolute coordinates is calculated. This calculation is conducted based on the position of the probe 71a on the absolute coordinates obtained in the first step and the reference position of the probe arrangement center $CL_4$ calculated in the second step. More specifically, if the position of at least one reference probe on the absolute coordinates becomes obvious, the positions of other probes and the position of the probe arrangement center $CL_4$ on the absolute coordinates are calculated by referring to the information on the relative positions of the probes 71a stored in the memory of the controller 8.

The probe arrangement center $CL_4$ is a position that must be ideally aligned with the center $CL_1$ of the card mounting opening. The relative position of the probe arrangement center $CL_4$ may be stored in the memory of the controller 8 in advance as part of the information on the relative positions of the probes 71a. Alternatively, as shown in FIG. 12, in identification of the probe positions, the positions of the two reference probes 71a arranged at the two ends in the X and Y directions may be detected, and the position of the probe arrangement center $CL_4$ may be specified as the position of the center of these two positions.

In the fourth step, the position of the probe arrangement center $CL_4$ on the absolute coordinates obtained in the third step and the position of the center $CL_1$ of the card mounting opening 74 on the absolute coordinates are compared, and a positional deviation between them is calculated. In this manner, the positional deviation which is cumulatively caused from the center $CL_1$ to $CL_4$ can be obtained.

In this manner, the final cumulative deviation in the mounting structure of the probe card 71 is recognized very efficiently. More specifically, the mounting deviation or error between the final center $CL_1$ and $CL_4$ can be recognized almost instantaneously and automatically without sequentially recognizing the individual deviations during mounting, i.e., the deviation between the centers $CL_1$ and $CL_2$, the deviation between the centers $CL_2$ and $CL_3$, and the deviation between the centers $CL_3$ and $CL_4$.

Subsequently, the wafer w is placed on the work table 3, and the actual examination step is executed. For examination, the work table 3 is driven, and examination is usually performed in units of semiconductor chips on the wafer W. The distal ends of the probes 71a are caused to be abutted against the corresponding electrode pads within the chip, and a test signal is sent from the tester to the chip through the probes 71. The electrical characteristics of the chip are measured in accordance with the response signal sent back from the chip.

During examination, the deviation, as the information obtained, between the center $CL_1$ and the probe arrangement center $CL_4$ on the absolute coordinates and, if necessary, the deviation of the probe card 71 in the θ direction are utilized. For example, a measuring reference point which is initially set at the center $CL_1$ is corrected based on the deviation between the centers $CL_1$ and $CL_4$, and index movement of the work table 3 is performed by referring to the corrected measuring reference point and, if necessary, to the deviation of the probe card 71 in the θ direction.

Regarding the difference in set position of the wafer W mounted on the work table 3 from one wafer to another in examination, automatic alignment as described in U.S. patent application No. 430,589 (U.S. Pat. No. 4,966,520) filed on Nov. 1, 1989 or Jpn. Pat. Appln. KOKAI Publication No. 2-224260 is performed, the teachings of which are hereby incorporated by reference.

More specifically, first, the camera 6 of the alignment unit 5 is used to detect the aligning direction of the semiconductor chips that are arranged on the wafer W. The wafer W is rotated such that the aligning direction coincides with the moving direction of the work table 3. Thus, the aligning direction of the electrode pads of the chips is aligned with the direction of the probes 71a. At the same time, of the reference patterns stored in advance in the memory of the controller 8, one that coincides with the detected chip aligning pattern is selected. The wafer is moved from a position under the wafer alignment unit 5 to a position under the probe card 71 along the corrected coordinates, thereby automatically aligning the electrode pads of the chips with the probes 71a.

Needle position identification described above is executed every time the probe card 71 is exchanged at the card mounting opening 74 of the apparatus. More specifically, a plurality of types of probe cards 71 having different probe arrangements are exchanged together with their ring inserts 72. When the probe card 71 is exchanged, the first to four steps described above are executed.

In the above embodiment, in the preliminary step of probe position identification, the position of the center $CL_1$ of the card mounting opening 74 on the absolute coordinates is stored in advance in the memory of the controller 8. However, a dummy card 81 as shown in FIG. 13 may also be used instead. The dummy card 81 forms a so-called dummy card having a congruent shape with that of the probe card 71 described above. The dummy card 81 has a substrate which is congruent with the probe card 71, e.g., of a disk shape, and made of a transparent material, e.g., glass. Crisscross reference lines 81a and 81b are engraved on the surface of the substrate, and the crossing point of the two lines forms a center 81b.

Before probe position identification, i.e., before mounting the probe card 71, the dummy card 81 is mounted in the card mounting opening 74. The center 81b of the dummy card 81 is detected through, e.g., the television camera 20, and the position of the center 81b on the absolute coordinates is stored in the memory of the controller 8. When the dummy card 81 is employed, in place of the center $CL_1$ of the card mounting hole 74, the center 81b of the dummy card 81 is set as the initial measuring reference point. Alignment which is the same as that of the above embodiment can be performed based on the center 81b of the dummy card 81.

Furthermore, the present invention can similarly be applied to a semiconductor chip group 85 having a so-called multi-layout as shown in FIG. 14. Referring to FIG. 14, a plurality of semiconductor chips 85a formed in the matrix manner are arranged on a wafer W. The probes of the probe card are arranged to correspond to these plurality of semiconductor chips 85a in order to test them at once. More specifically, the probes are provided to have a one-to-one correspondence with the electrode pads of the plurality of semiconductor chips 85a.

various types of data concerning the number of chips and the arrangement of chips of the multi-layout chip group 85, the sizes of the respective semiconductor chips 85a, and the like are stored in the prober in advance. The probes of the probe card for testing the semiconductor chip group 85 at once are designed based on these data. When probe position identification of such a probe card is to be performed, an operation is performed to align a center 85b of an appropriate one chip 85a of the semiconductor chip group 85 with the position of the corresponding probe card by utilizing these data.

The present invention has been described so far by way of the semiconductor wafer prober. The present invention can similarly be applied to other probers, e.g., an LCD substrate probe apparatus, that performs examination by using a probe card.

What is claimed is:

1. A method of identifying a position of a probe card having a plurality of probes for probing a test target, on which a plurality of semiconductor devices are arranged, in a probing apparatus including a card mounting portion for mounting said probe card, said probe card having a probe arrangement center to be aligned with a center of said card mounting portion, and a condition concerning an angular orientation to be set with respect to said card mounting portion, a work table for placing said test target thereon such that said test target opposes said card mounting portion, said work table being movable within a three-dimensional coordinate system, first optical detecting means attached to said work table for image-recognizing said probes, second optical detecting means arranged above said work table for image-recognizing said semiconductor devices, a controller for controlling an operation of said work table, and a tester for sending a test signal to each of said semiconductor devices through said probes, said method comprising the steps of:

storing a position of said center of said card mounting portion on absolute coordinates and relative positions of said probes on said probe card in said controller;

mounting said probe card on said card mounting portion;

moving said work table by said controller with reference to said position of said center of said card mounting portion and said relative positions of said probes stored in said controller, so as to respectively image-recognize first and second reference probes of said probes by said first optical detecting means, and detecting and storing, in said controller, positions of said first and second reference probes on said absolute coordinates;

calculating relative positions of said probe arrangement center relative to said first and second reference probes with said controller with reference to said relative positions of said probes stored in said controller;

calculating a position of said probe arrangement center on said absolute coordinates with said controller, based on said positions of said first and second reference probes on said absolute coordinates and said relative positions of said probe arrangement center; and calculating a positional error of said position of said probe arrangement center with respect to said position of said center of said card mounting portion on said absolute coordinates, and a deviation of said probe card in said angular orientation with said controller, thereby identifying positions of said probes on said absolute coordinates.

2. The method according to claim 1, wherein said test target comprises a semiconductor wafer, and said semiconductor devices comprise IC chips each having electrode pads to be brought into contact with said probes.

3. The method according to claim 1, wherein said probes are arranged to be brought into contact with plural ones of said semiconductor devices at a time.

4. A method of probing a plurality of test targets, on each of which a plurality of semiconductor devices are arranged, in a probe apparatus including a probe card having a plurality of probes, a card mounting portion for mounting said probe card, said probe card having a probe arrangement center to be aligned with a center of said card mounting portion, and a condition concerning an angular orientation to be set with respect to said card mounting portion, a work table for placing each test target thereon such that each test target opposes said card mounting portion, said work table being movable within a three-dimensional coordinate system, first optical detecting means attached to said work table for image-recognizing said probes, second optical detecting means arranged above said work table for image-recognizing said semiconductor devices, a controller for controlling an operation of said work table, and a tester for sending a test signal to each of said semiconductor devices through said probes, said method comprising the steps of:

storing a position of said center of said card mounting portion on absolute coordinates and relative positions of said probes on said probe card in said controller;

mounting said probe card on said card mounting portion;

moving said work table by said controller with reference to said position of said center of said card mounting portion and said relative positions of said probes stored in said controller, so as to respectively image-recognize first and second reference probes of said probes by said first optical detecting means, and detecting and storing, in said controller, positions of said first and second reference probes on said absolute coordinates;

calculating relative positions of said probe arrangement center relative to said first and second reference probes with said controller with reference to said relative positions of said probes stored in said controller;

calculating a position of said probe arrangement center on said absolute coordinates with said controller, based on said positions of said first and second reference probes on said absolute coordinates and said relative positions of said probe arrangement center;

calculating a positional error of said position of said probe arrangement center with respect to said position of said center of said card mounting portion on said absolute coordinates, and a deviation of said probe card in said angular orientation with said controller, thereby identifying positions of said probes on said absolute coordinates; and mounting said test targets respectively on said work table, bringing said probes into contact with said semiconductor devices by moving said worktable, and testing an electrical characteristic of said semiconductor devices by said tester, wherein positions of said semiconductor devices of each test target are detected by said second optical detecting means, and each test target is aligned with said probes by moving said work table with reference to said detected positions of said semiconductor devices, and wherein positions of said semiconductor devices are detected at every test target, and said identified positions of said probes are used in said alignment of said test targets in common.

5. The method according to claim 4, wherein said test targets comprise semiconductor wafers, and said semiconductor devices comprise IC chips each having electrode pads to be brought into contact with said probes.

6. The method according to claim 4, wherein said probes are arranged to be brought into contact with plural ones of said semiconductor devices at a time.

* * * * *